(12) United States Patent
Omachi et al.

(10) Patent No.: US 8,092,914 B2
(45) Date of Patent: Jan. 10, 2012

(54) HEAT SINK SUBSTRATE AND PRODUCTION METHOD FOR THE SAME

(75) Inventors: Masahiro Omachi, Toyama (JP); Akira Fukui, Toyama (JP); Toshiya Ikeda, Toyama (JP)

(73) Assignee: A.L.M.T. Corp., Tokyo (JP)

( * ) Notice: Subject to any disclaimer, the term of this patent is extended or adjusted under 35 U.S.C. 154(b) by 880 days.

(21) Appl. No.: 11/790,390

(22) Filed: Apr. 25, 2007

(65) Prior Publication Data
US 2007/0252267 A1    Nov. 1, 2007

(30) Foreign Application Priority Data

Apr. 27, 2006  (JP) ................................. 2006-124092

(51) Int. Cl.
*B32B 9/04* (2006.01)
(52) U.S. Cl. ..................... 428/450; 428/210; 428/304.4; 428/307.3; 428/307.7; 428/446; 257/713; 257/720
(58) Field of Classification Search .................. 428/210, 428/446, 304.4, 405, 307.3, 307.7; 257/713, 257/720
See application file for complete search history.

(56) References Cited

U.S. PATENT DOCUMENTS

| | | | |
|---|---|---|---|
| 5,006,417 A * | 4/1991 | Jackson et al. ................ | 428/614 |
| 5,179,049 A | 1/1993 | Numata et al. | |
| 6,123,895 A | 9/2000 | Yamagata et al. | |
| 6,507,105 B1 | 1/2003 | Yamagata et al. | |
| 6,737,168 B1 | 5/2004 | Yamagata et al. | |
| 7,141,309 B2 * | 11/2006 | Kinoshita et al. .......... | 428/539.5 |
| 7,442,662 B2 | 10/2008 | Morimoto et al. | |
| 2005/0124483 A1 | 6/2005 | Morimoto et al. | |

FOREIGN PATENT DOCUMENTS

| | | |
|---|---|---|
| EP | 1 114 807 A1 | 7/2001 |
| EP | 1 466 879 A1 | 10/2004 |
| JP | 01-234370 | 9/1989 |
| JP | 05-032458 | 2/1993 |
| JP | 11-310843 | 11/1999 |
| JP | 2000-141022 | 5/2000 |
| JP | 2002-294358 | 10/2002 |
| JP | 2003-78086 | 3/2003 |
| JP | 2003-197825 | 7/2003 |
| JP | 2004-281851 | 10/2004 |
| WO | WO-00/76940 | 12/2000 |

OTHER PUBLICATIONS

E. Scafe et al., "Thermal Diffusivity of Silicon-Silicon Carbide Composites", Advanced Structural Inorganic Composites, P. Vincenzini (Editor), published by Elsevier Science Publishers B. V., 1991.

* cited by examiner

*Primary Examiner* — Cathy Lam
(74) *Attorney, Agent, or Firm* — Rabin & Berdo, PC

(57) ABSTRACT

A heat sink substrate has a composite structure including a three-dimensional network structure of SiC ceramic having pores infiltrated with Si, and has a thermal conductivity of not less than 150 W/m·K and an oxygen content of not greater than 7 ppm. The heat sink substrate is easily allowed to have an increased surface area. Further, the heat sink substrate has a higher thermal conductivity and a coefficient thermal expansion close to that of the SiC. Therefore, the heat sink substrate is superior in the efficiency of heat conduction from a semiconductor device. The heat sink substrate is produced by infiltrating a thermally melted Si into the pores of the three-dimensional network structure in a non-oxidative atmosphere in the presence of an oxygen absorber.

4 Claims, 1 Drawing Sheet

US 8,092,914 B2

HEAT SINK SUBSTRATE AND PRODUCTION METHOD FOR THE SAME

TECHNICAL FIELD

The present invention relates to a heat sink substrate which is advantageously used for transfer of heat from a semiconductor device such as a power semiconductor device of a power module or other power device requiring higher transfer of heat, and to a production method for the same.

BACKGROUND ART

Exemplary power devices include power modules (power supply units) for converting power from AC to DC in information appliances such as personal computers, OA appliances and household appliances, and power devices for converting power from DC to AC for driving induction motors and the like in electric automobiles and hybrid automobiles. Such a power device generally includes a power semiconductor device, and a highly heat-conductive heat sink substrate having a mount surface on which the power semiconductor device is mounted for transferring heat generated by the semiconductor device during operation thereof.

A Si semiconductor device is generally used as the power semiconductor device. The Si semiconductor device typically includes a Si chip including a semiconductor circuit formed in a Si monocrystalline substrate thereof, and a circuit substrate having interconnections and the like for connection to the Si chip with the Si chip being mounted thereon. The circuit substrate has an insulative property, and is formed of AlN or the like which has a relatively high thermal conductivity.

Usable as the heat sink substrate on which the Si semiconductor device is to be mounted is a metal substrate such as of Cu, Al, Cu—Mo or Cu—W which has higher thermal conductivity and ensures easier production of a large-area heat sink substrate than AlN. A resin adhesive, a solder or the like is used for bonding each member mentioned above. In recent years, the power devices are required to have a higher output. However, the conventional Si semiconductor device is unlikely to meet this requirement.

To meet the aforesaid requirement, a SiC semiconductor device including a SiC chip having a SiC monocrystalline substrate formed with a semiconductor circuit is under development as an alternative to the Si semiconductor device for practical use as a power semiconductor device. SiC is about three times greater than Si in band gap. This physical property advantageously imparts the SiC semiconductor device with higher breakdown voltage and capability of operating at higher temperatures with a lower loss. Particularly, the SiC semiconductor device is stably operable at a temperature of 250 to 300° C. Therefore, the use of the SiC semiconductor device conceivably makes it possible to significantly increase the output of the power device as compared with the Si semiconductor device.

Since the SiC semiconductor device has a high operating temperature as described above, the heat sink substrate is required to have:
(a) a higher thermal conductivity as described above; and
(b) a coefficient thermal expansion close to that of SiC ($4.2 \times 10^{-6}$/K) for relaxation of a thermal stress during operation of the semiconductor device. However, the conventional metal substrate has a coefficient thermal expansion of not less than $5 \times 10^{-6}$/K, which is significantly different from that of SiC. Therefore, the conventional metal substrate fails to meet the requirement (b) and, hence, is not suitable as the heat sink substrate for the SiC semiconductor device.

To this end, a Si—SiC composite is under development as a heat sink substrate material which has a coefficient thermal expansion close to that of the SiC semiconductor device. Known examples of the composite are Si—SiC composites prepared by a reaction sintering method (E. Scafe et al., "Thermal Diffusivity of Silicon-Silicon Carbide Composites", ADVANCED STRUCTURAL INORGANIC COMPOSITES, P. Vincenzini (Editor), published by Elsevier Science Publishers B. V., 1991). However, a size of the Si—SiC composite product produced by the reaction sintering method is limited. Therefore, it is difficult to produce a larger area heat sink substrate from the Si—SiC composite by the reaction sintering method.

To cope with this problem, there are proposed heat sink substrates each formed of a Si—SiC composite prepared by a so-called melt-infiltration method (see WO00/076940A1 and JP2004-281851A). Namely the Si—SiC composite is prepared by forming a three-dimensional network structure of SiC ceramic, infiltrating thermally melted Si melt into pores of the network structure, and cooling the resulting structure to solidify Si, and at least a surface of the resulting Si/SiC composite structure later serving as a mount surface of the heat sink substrate is polished as required.

The size of the Si—SiC composite structure prepared by the melt-infiltration method is defined by the size of the three-dimensional network structure. The three-dimensional network structure is formed as having a desired size, for example, by mixing ceramic powder containing SiC powder with an organic binder, forming the resulting mixture into a predetermined shape, and firing the resulting product to remove the organic binder and sinter the ceramic powder. This makes it easy to produce a heat sink substrate having an increased surface area.

A research conducted by the inventors shows that the conventional Si—SiC composite heat sink substrates produced by the melt-infiltration method described in the above patent publications satisfy the requirements (a) and (b), and are each allowed to have an increased surface area as described above. However, the efficiency of heat conduction from a semiconductor device such as a SiC semiconductor device mounted on the mount surface is lower. Therefore, these heat sink substrates are revealed to fail in providing a sufficient transfer of heat effect.

SUMMARY OF THE INVENTION

It is an object of the present invention to provide a heat sink substrate which has a higher thermal conductivity and a coefficient thermal expansion close to that of SiC and ensures highly efficient heat conduction from a semiconductor device and, in addition, is easily allowed to have an increased surface area, and to provide a production method for the heat sink substrate.

To solve the aforementioned problems, the inventors conducted a study on cause of reduction in efficiency of the heat conduction to the conventional Si—SiC composite heat sink substrate produced by the melt-infiltration method from the semiconductor device mounted on the heat sink substrate. As a result, the inventors found that the conventional heat sink substrate has a multiplicity of defects of any of the following types (i) to (iii) in its mount surface, and the defects prevent proper heat conduction from the semiconductor device to the heat sink substrate to reduce the overall heat conduction efficiency:

(i) a vacant pore having a diameter of 0.3 to 1.0 mm, or a Si block filling the vacant pore with Si;
(ii) a rough surface portion constituted by a plurality of minute vacant pores gathering in a surface direction, and having a diameter of 1.0 to 2.0 mm; and
(iii) a crack-like portion constituted by a plurality of minute vacant pores linearly connected to one another, and having a length of 1.0 to 2.0 mm.

Since the SiC semiconductor device has a higher operating temperature on the order of 250 to 300° C. as previously described, a solder or a brazing filler metal is used for bonding the SiC semiconductor device onto the heat sink substrate. Where a multiplicity of vacant pores of the type (i) or crack-like portions of the type (iii) are present in the mount surface of the heat sink substrate, it is impossible to sufficiently fill the vacant pores or the crack-like portions with the solder or the brazing filler metal. Therefore, a multiplicity of minute gaps occur between the mount surface of the heat sink substrate and a bonding surface of the semiconductor device bonded to the mount surface due to the vacant pores or the crack-like portions. The multiplicity of gaps prevent the heat conduction from the semiconductor device to the heat sink substrate, thereby reducing the overall heat conduction efficiency.

Where a multiplicity of Si blocks of the type (i) are present in the mount surface, the multiplicity of Si blocks prevent the heat conduction from the semiconductor device, because Si of the Si blocks has a lower thermal conductivity than SiC. As a result, the overall heat conduction efficiency is reduced. Further, where a multiplicity of rough surface portions of the type (ii) are present in the mount surface, the rough surface portions of the mount surface significantly differ in surface roughness from the other mount surface portion.

In order to ensure proper heat conduction, the mount surface of the heat sink substrate is generally finished into a smooth surface having a maximum height of profile Rz of about 1.5 to about 2.0 µm, particularly about 1.9 µm as specified by Japanese Industrial Standards JIS B0601:2001 "Geometrical Product Specifications (GPS)—Surface texture: Profile method—Terms, definitions and Surface texture parameters." However, the rough surface portions of the mount surface each have a greater maximum height Rz on the order of 3.0 to 5.0 µm, particularly about 3.6 µm, even after the surface finishing. Therefore, the solder or the brazing filler metal are less fluid on the rough surface portions of the mount surface than on the other mount surface portion smoothly finished. Hence, the rough surface portions cause local bonding failures between the heat sink substrate and the semiconductor device mounted on the heat sink substrate. A multiplicity of bonding failures prevent the heat conduction from the semiconductor device to the heat sink substrate, thereby reducing the overall heat conduction efficiency.

In the case of the conventional Si semiconductor device having a relatively low operating temperature below 120° C., the reduction in the efficiency of the heat conduction from the semiconductor device to the heat sink substrate due to the multiplicity of defects of any of the types (i) to (iii) present in the mount surface of the heat sink substrate is not a serious problem. In the case of the SiC semiconductor device having a higher operating temperature, however, the multiplicity of defects prevent the heat conduction from the semiconductor device to the heat sink substrate in a greater number of areas of the mount surface to reduce the overall heat conduction efficiency as described above. This may result in an insufficient transfer of heat effect, which is liable to increase the temperature of the SiC semiconductor device. If the temperature of the SiC semiconductor device exceeds the aforementioned temperature range which ensures stable operation of the SiC semiconductor device, the SiC semiconductor device is liable to suffer from a malfunction, an error and/or breakdown, or liable to be separated from the heat sink substrate due to a thermal history associated with the temperature increase.

In order to minimize the number of the defects of the types (i) to (iii) present in the mount surface of the heat sink substrate, the inventors conducted a study on the mechanism of the occurrence of the defects. As a result, the inventors found that the defects of the types (i) to (iii) occur because the thermally melted Si melt is not smoothly infiltrated into the pores of the three-dimensional SiC network structure in the production of the Si—SiC composite by the melt-infiltration method, and that the Si melt is not smoothly infiltrated into the pores because surface Si of the melt is oxidized by unwanted oxygen present in a melt-infiltration system.

That is, the surface Si of the melt is oxidized into $SiO_2$ by the unwanted oxygen present in the melt-infiltration system and, when the melt is infiltrated into the pores of the three-dimensional network structure, the surface $SiO_2$ adheres to interior surfaces of the pores to form a film less wettable with the Si melt. As a result, the wettability of the three-dimensional network structure with the melt is reduced to prevent smooth infiltration of the Si melt into the pores. If the Si melt is not smoothly infiltrated into the pores of the three-dimensional network structure, some of the vacant pores unfilled with the Si melt are occurred in the three-dimensional network structure.

When the resulting structure is thereafter cooled to solidify Si, a stress caused by thermal expansion is concentrated on the vacant pores. Further, $SiO_2$ excessively adhering to walls in the pores causes a stress due to a difference in coefficient thermal expansion between $SiO_2$ and SiC during the cooling, thereby collapsing the three-dimensional network structure. This results in formation of voids greater in size than the vacant pores. The vacant pores and the voids are exposed in the mount surface of the heat sink substrate by the subsequent polishing, resulting in defects of any of the types (i) to (iii) depending on the sizes and distribution of the vacant pores or the voids.

As shown in a microscopic photograph of FIG. 1 obtained, for example, by photographing the mount surface of the heat sink substrate by means of a stereoscopic microscope, voids of diameters of 0.3 to 1.0 mm exposed in the mount surface (such as indicated by two juxtaposed black areas in FIG. 1) are each defined as the vacant pore of the type (i). The Si melt is more liable to flow into the greater-sized voids. As shown in a microscopic photograph of FIG. 2 obtained by photographing the mount surface of the heat sink substrate by means of the stereoscopic microscope, solid Si portions of diameters of 0.3 to 1.0 mm (such as indicated by a white area with black shades due to lighting in FIG. 2) which are exposed in the mount surface by the polishing after the Si melt is infiltrated into the voids and cooled to be solidified are each defined as the Si block of the type (i). In some conventional composite production processes employing the melt-infiltration method, the Si blocks are positively formed in order to eliminate the vacant pores and the voids to increase the density of the composite. However, the Si blocks exposed in the mount surface of the heat sink substrate prevent the heat conduction from the semiconductor device as described above, so that the number of the Si blocks should be minimized.

Even if the exposed vacant pores each have a diameter less than 0.3 mm, such vacant pores gathering in a surface direction having a diameter of 1.0 to 2.0 mm constitute the rough surface portion of the type (ii). Even if the exposed vacant pores each have a diameter less than 0.3 mm, such vacant pores linearly connected to one another and having a total length of 1.0 to 2.0 mm constitute the crack-like portion of the type (iii).

Therefore, the oxygen content of the Si—SiC composite heat sink substrate produced by the melt-infiltration method should be minimized to minimize the number of the defects of the types (i) to (iii) present in the mount surface of the heat sink substrate. In order to provide a heat sink substrate having a significantly improved efficiency of heat conduction from the semiconductor device, the inventors conducted a study on how much the oxygen content of the heat sink substrate should be reduced to significantly reduce the number of defects of the types (i) to (iii) present in the mount surface of the heat sink substrate as compared with the conventional Si—SiC composite heat sink substrates produced by the melt-infiltration method as described in the aforementioned patent publications. As a result, the inventors found that the oxygen content is preferably not greater than 7 ppm.

According to the present invention, there is provided a heat sink substrate having a mount surface on which a semiconductor device is to be mounted, characterized by comprising a composite structure composed of a three-dimensional network structure of SiC ceramic having pores infiltrated with Si, having a thermal conductivity of not less than 150 W/m·K, and an oxygen content of not greater than 7 ppm.

Where the heat sink substrate has an oxygen content in the aforesaid range, number of defects of at least one of the following types (i) to (iii) present in a unit area of the mount surface of the heat sink substrate is reduced to not greater than one defect per 50 cm$^2$:
(i) a vacant pore having a diameter of 0.3 to 1.0 mm, or a Si block filling the vacant pore with Si;
(ii) a rough surface portion constituted by a plurality of minute vacant pores gathering in a surface direction, and having a diameter of 1.0 to 2.0 mm; and
(iii) a crack-like portion constituted by a plurality of minute vacant pores linearly connected to one another, and having a length of 1.0 to 2.0 mm. Thus, the efficiency of the heat conduction from the semiconductor device to the heat sink substrate can be drastically improved.

Where the vacant pore or the Si block each have a circular shape, the diameters thereof are herein each defined as the diameter of the circle. Where the vacant pore or the Si block each have an oval or non-circular shape, the diameters thereof are herein each defined as a maximum diameter of the shape. Similarly, where the plurality of vacant pores gather in a circular shape to constitute the rough surface portion, the diameter of the rough surface portion is herein defined as the diameter of the circle. Where the plurality of vacant pores gather in an oval or non-circular shape to constitute the rough surface portion, the diameter of the rough surface portion is herein defined as a maximum diameter of the shape.

The heat sink substrate of the present invention is basically produced by the melt-infiltration method and, therefore, easily allowed to have a larger surface area. For example, the mount surface may have a surface area of 50 to 1000 cm$^2$. Further, the thermal conductivity of the heat sink substrate is preferably not less than 200 W/m·K in order to improve the transfer of heat capability of the heat sink substrate and to further assuredly prevent the aforementioned problems associated with the semiconductor device (e.g., a SiC semiconductor device) mounted on a heat dissipating surface of the heat sink substrate.

The mount surface of the heat sink substrate of the present invention is preferably coated with a plating layer in order to improve the wettability of the mount surface with a solder or a brazing filler metal to properly bond the semiconductor device to the mount surface with the solder or the brazing filler metal for suppression of the reduction in the heat conduction from the semiconductor device to the heat sink substrate.

An area of the plating layer other than an area which a semiconductor device is to be mounted is preferably covered with a resist film in order to prevent the solder or the brazing filler metal from spreading out of the area which a semiconductor device is to be mounted and to ensure that the semiconductor device is properly bonded to the heat sink substrate by providing a sufficient amount of the solder or the brazing filler metal between the bonding surface of the semiconductor device and the mounting surface of the heat sink substrate for suppression of the reduction in the efficiency of the heat conduction from the semiconductor device to the heat sink substrate.

For production of the heat sink substrate of the present invention having an oxygen content of not greater than 7 ppm and hence having a significantly reduced number of defects of the types (i) to (iii) in its mount surface, surface Si of the Si melt to be infiltrated into the pores of the three-dimensional SiC network structure by the melt-infiltration method should be prevented from being oxidized by unwanted oxygen present in the melt-infiltration system as described above. Therefore, oxygen present in the system should be minimized.

In the conventional Si—SiC composite production processes employing the melt-infiltration method as described in the patent publications, the infiltration of the Si melt into the pores of the three-dimensional network structure is carried out in a non-oxidative atmosphere, for example, in a vacuum or in an inert gas atmosphere. According to the inventors' study, however, these processes are insufficient for the prevention of the oxidation. That is, a trace amount of oxygen present in the system prevents the melted Si melt from being infiltrated into the pores by the mechanism described above. Therefore, the conventional processes fail to produce the heat sink substrate of the present invention which has an oxygen content of not greater than 7 ppm and a significantly reduced number of defects of the types (i) to (iii) in its mount surface.

The inventors conducted a study on a method of smoothly infiltrating the melted Si melt into the pores by removing the trace amount of oxygen present in the system as much as possible. As a result, the inventors came up with an idea that the infiltration of the Si melt into the pores and the solidification of the Si melt by cooling are carried out in a non-oxidative atmosphere in the presence of an oxygen absorber which is disposed in non-contact with the three-dimensional network structure and the Si in the system and absorbs oxygen at a temperature not lower than the melting point of Si. With this method, the heat sink substrate with the number of the defects of the types (i) to (iii) in the unit area of the mount surface thereof falling within the range specified by the present invention can be mass-produced with a high yield without relying on accidental events.

That is, the present invention provides a method of producing the heat sink substrate, which comprises the steps of infiltrating a three-dimensional network structure of SiC ceramic with a thermally melted Si, and cooling the resulting structure to solidify the Si, wherein the infiltrating step and the cooling step are performed in a non-oxidative atmosphere in the presence of an oxygen absorber which is disposed in non-contact with the three-dimensional network structure and Si and absorbs oxygen at a temperature not lower than the melting point of Si.

It is preferred to use Al as the oxygen absorber. Further, it is preferred that Al is used in the form of an Al/SiC ceramic composite in order to prevent Al from being melted to be fluidized when Si is thermally melted.

BEST MODE FOR CARRYING OUT THE INVENTION

Figure 1:
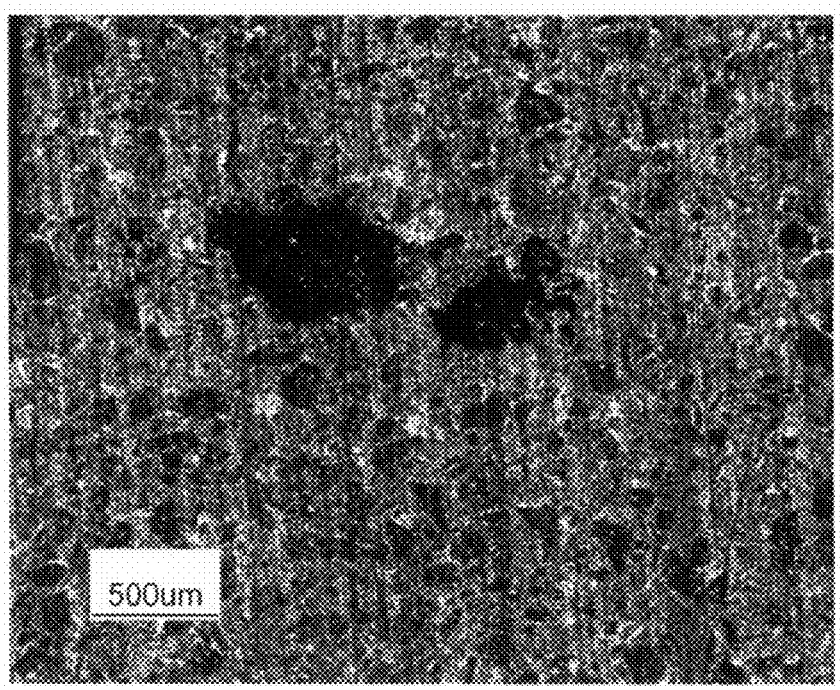
FIG. 1 is a microscopic photograph showing exemplary vacant pores of diameters of 0.3 to 1.0 mm, which are defects of one of the types (i) to (iii) present in a mount surface of a heat sink substrate.
Figure 2:
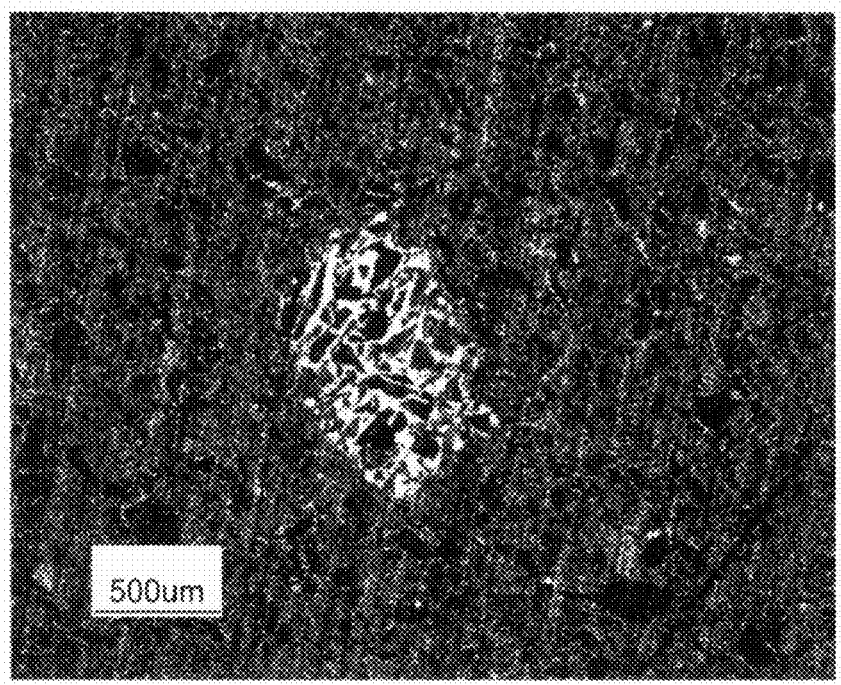
FIG. 2 is a microscopic photograph showing an exemplary Si block filling the vacant pore with Si, which is a defect of one of the types (i) to (iii) present in the mount surface of the heat sink substrate.

The heat sink substrate of the present invention having a mount surface on which a semiconductor device to be mounted; comprises a composite structure composed of a three-dimensional network structure of SiC ceramic having pores infiltrated with Si, having a thermal conductivity of not less than 150 W/m·K, and an oxygen content of not greater than 7 ppm.

Where the oxygen content of the heat sink substrate is not greater than 7 ppm, the number of defects of the following types (i) to (iii) present in the mount surface of the heat sink substrate can be significantly reduced:
(i) a vacant pore having a diameter of 0.3 to 11.0 mm, or a Si block filling the vacant pore with Si;
(ii) a rough surface portion constituted by a plurality of minute vacant pores gathering in a surface direction, and having a diameter of 1.0 to 2.0 mm; and
(iii) a crack-like portion constituted by a plurality of minute vacant pores linearly connected to one another, and having a length of 1.0 to 2.0 mm.
Thus, the efficiency of the heat conduction from the semiconductor device to the heat sink substrate can be drastically improved as compared with a heat sink substrate having an oxygen content falling outside the aforesaid range. This is apparent from the mechanism previously described, and will become apparent from the following examples of the present invention.

In order to further improve the aforesaid effect, the oxygen content of the heat sink substrate is preferably not greater than 4 ppm in the aforesaid range. The lower limit of the oxygen content is 0 ppm, and the heat sink substrate preferably contains no oxygen. In order to reduce the oxygen content to 0 ppm, however, a strict control is required in the production process, affecting the productivity and production costs of the heat sink substrate. In practice, the oxygen content of the heat sink substrate is preferably 2 ppm or greater.

The oxygen content of the heat sink substrate is herein defined as a value determined through an inert gas fusion-infrared absorption method, for example, by means of an oxygen/nitrogen analyzer (EMGA-620 W available from Horiba Ltd.)

According to the present invention, the number of defects of at least one of the aforesaid types (i) to (iii) present in a unit area of the mount surface of the heat sink substrate is reduced to not greater than one defect per 50 cm$^2$ by reducing the oxygen content of the heat sink substrate to not greater than 7 ppm. This drastically improves the efficiency of the heat conduction from the semiconductor device to the heat sink substrate.

Where the numbers of the defects of the respective types (i) to (iii) fall outside the aforesaid range, an excessively great number of defects are present in the mount surface, thereby increasing the number of defective areas in which the heat conduction from the semiconductor device mounted on the mount surface is hampered. This may reduce the efficiency of the heat conduction from the semiconductor device to the heat sink substrate.

In the present invention, it is preferred that the numbers of defects of two types of the three types (i) to (iii) fall within the aforesaid range, and it is further preferred that the numbers of defects of all the three types (i) to (iii) fall within the aforesaid range in order to minimize the total number of defects.

The lower limit of the number of defects of each of the types is 0 defect per 50 cm$^2$. Particularly, it is ideal that the total number of the defects of all the types is 0 defect per 50 cm$^2$ and none of the defects of the types (i) to (iii) is present in the mount surface. For improvement of the yield in the production of the heat sink substrate, however, it is preferred that the number of defects of at least one of the three types (i) to (iii) present in the unit area is not greater than 0.6 defect per 50 cm$^2$, and it is further preferred that the total number of the defects of all the three types (i) to (iii) present in the unit area is not greater than 1 defect per 50 cm$^2$.

In the present invention, defects appearing in a microscopic photograph obtained by photographing the mount surface of the heat sink substrate at a predetermined magnification factor by means of a stereoscopic microscope are counted for each of the types (i) to (iii), and an average of the numbers of defects in a plurality of heat sink substrates produced under the same conditions is calculated for each of the types and converted to a value per unit area (50 cm$^2$) of the mount surface for determination of the number of the defects of each of the types (i) to (iii).

The diameter of the vacant pore of the type (i) is limited to the range of 0.3 to 1.0 mm. Where vacant pores each having a diameter smaller than 0.3 mm constitute neither a rough surface portion of the type (ii) nor a crack-like portion of the type (iii) but are independently present in the mount surface, any minute gaps which may otherwise hamper the heat conduction do not occur when the semiconductor device is mounted on the heat sink substrate with the vacant pores covered with the solder or the brazing filler metal. Hence, the heat conduction efficiency is not reduced. Therefore, the number of the vacant pores each having a diameter smaller than 0.3 mm is not particularly limited, as long as such vacant pores are present independently.

The diameter of the Si block of the type (i) is limited to the range of 0.3 to 1.0 mm. Since a very small amount of Si is present in a Si block having a diameter smaller than 0.3 mm, the heat conduction efficiency is not reduced. Therefore, the number of Si blocks each having a diameter smaller than 0.3 mm is not particularly limited.

If even a single vacant pore or Si block having a diameter greater than 1.0 mm is present in the mount surface, the efficiency of the heat conduction from the semiconductor device to the heat sink substrate is significantly reduced. Therefore, any vacant pore or Si block having a diameter greater than 1.0 mm should not be present in the mount surface. A heat sink substrate having even a single greater-sized vacant pore or Si block is rejected as a defective product.

The diameter of the rough surface portion of the type (ii) is limited to the range of 1.0 to 2.0 mm. Where the diameter of the rough surface portion is smaller than 1.0 mm, the rough surface portion can be coated with the solder or the brazing filler metal in the same manner as a smoothly finished area other than the rough surface portion. Hence, a local bonding failure which may otherwise hamper the heat conduction does not occur, so that the heat conduction efficiency is not reduced. Therefore, the number of rough surface portions each having a diameter smaller than 1.0 mm is not particularly limited.

If even a single rough surface portion having a diameter greater than 2.0 mm is present in the mount surface, the efficiency of the heat conduction from the semiconductor device to the heat sink substrate is significantly reduced. Therefore, any rough surface potion having a diameter greater than 2.0 mm should not be present in the mount surface. A heat sink substrate having even a single greater-sized a rough surface portion is rejected as a defective product.

The length of the crack-like portion of the type (iii) is limited to the range of 1.0 to 2.0 mm. Where the crack-like portion of the type (iii) has a length smaller than 1.0 mm, any minute gaps which may otherwise hamper the heat conduction do not occur when the semiconductor device is mounted on the heat sink substrate with the crack-like portion covered with the solder or the brazing filler metal. Hence, the heat conduction efficiency is not reduced. Therefore, the number of crack-like portions each having a length smaller than 1.0 mm is not particularly limited.

If even a single crack-like portion having a length greater than 2.0 mm is present in the mount surface, the efficiency of the heat conduction from the semiconductor device to the heat sink substrate is significantly reduced. Therefore, any crack-like potion having a length greater than 2.0 mm should not be present in the mount surface. A heat sink substrate having even a single greater-sized crack-like portion is rejected as a defective product.

The thermal conductivity of the heat sink substrate is limited to a range not less than 150 W/m·K. If the thermal conductivity of the heat sink substrate is less than this range, the heat conduction of the heat sink substrate per se is too poor. Therefore, even if the number of the defects of the types (i) to (iii) present in the unit area of the mount surface falls within the aforesaid range and hence the efficiency of the heat conduction from the semiconductor device (e.g. a SiC semiconductor device) to the heat sink substrate is excellent, heat generated by the semiconductor device during operation cannot be properly transferred, thereby increasing the temperature of the semiconductor device. This may result in a malfunction and an error of the semiconductor device, breakdown of the semiconductor device, or separation of the semiconductor device from the heat sink substrate due to a thermal history associated with the temperature increase. In order to ensure proper transfer of the heat generated by the semiconductor device, the thermal conductivity of the heat sink substrate is preferably not less than 200 W/m·K in the aforesaid range.

The upper limit of the thermal conductivity of the heat sink substrate is theoretically the thermal conductivity of the SiC ceramic per se (e.g., 500 W/m·K in the case of a 6H—SiC monocrystal). In practice, however, the reduction of the thermal conductivity due to grain boundaries of SiC particles should be taken into consideration, because the three-dimensional network structure is produced by sintering ceramic powder containing SiC powder. Further, the reduction of the thermal conductivity due to the infiltration of the lower thermal conductivity Si in the pores of the three-dimensional network structure should be taken into consideration. Therefore, the thermal conductivity of the heat sink substrate is preferably not greater than 270 W/m·K.

In consideration of consistency in coefficient thermal expansion between the heat sink substrate of the present invention and the SiC semiconductor device, the heat sink substrate preferably has a coefficient thermal expansion not greater than $5 \times 10^{-6}$/K, particularly $3.0 \times 10^{-6}$/K to $4.0 \times 10^{-6}$/K. In order to control the thermal conductivity and coefficient thermal expansion of the heat sink substrate within the aforesaid ranges, the weight ratio between the three-dimensional network structure and the Si infiltrated in the pores of the three-dimensional network structure may be controlled by controlling the void ratio of the three-dimensional network structure of the composite for the heat sink substrate, or conditions for firing a product comprising the ceramic powder as a precursor of the three-dimensional network structure are properly controlled.

The three-dimensional network structure which composes the heat sink substrate of the present invention can be prepared in the same manner as in the conventional. That is, the preparation of the three-dimensional network structure is achieved by forming a mixture of an organic binder and ceramic powder essentially containing the SiC powder into a predetermine shape and firing the resulting product for removing the organic binder and sintering the ceramic powder.

The SiC powder preferably has a purity of not less than 95 wt %, particularly not less than 98 wt %, with a minimum amount of impurities such as oxygen, nitrogen and transmission metal elements including iron group elements (Fe, Ni and Co) which may hamper the proper heat conduction due to phonon in the ceramic. A 6H- or 4H-crystalline SiC or α-SiC powder containing a high percentage of the 6H- or 4H-crystalline SiC is preferably used as the SiC powder.

In order to prepare a compact and uniform three-dimensional network structure superior in thermal conductivity, the SiC powder preferably has particle diameters of 10 to 100 μm, particularly 30 to 60 μm. A single type of SiC powder having a single particle size distribution within the aforesaid range or two or more types of SiC powder having different particle size distributions within the aforesaid range may be used as the SiC powder.

Additives such as Si powder and C powder may be added to the SiC powder in the ceramic powder. The total amount of these additives is preferably not greater than 5 wt %, particularly not greater than 0.5 wt %, based on the total amount of the ceramic powder. If the total amount of the additives is greater than the aforesaid range, the proportion of the SiC powder is relatively reduced, thereby possibly reducing the thermal conductivity of the heat sink substrate and increasing the coefficient thermal expansion.

Any of various organic binders may be used as the organic binder, as long as it functions as a binder for the ceramic powder and is capable of maintaining the shape of the product formed from the mixture and thermally decomposable to be removed from the product during the firing for the formation of the pores in the three-dimensional network structure. A polymer soluble in a given solvent is particularly preferred.

The amount of the organic binder to be added may be properly determined according to the void ratio of the three-dimensional network structure to be prepared. However, it is preferred to determine the amount of the organic binder so as to set the void ratio of the three-dimensional network structure in such a range that the weight ratio $W_{Si}/W_{SiC}$ of the Si infiltrated in the pores of the three-dimensional network structure to the SiC ceramic of the three-dimensional network structure is $W_{Si}/W_{SiC}$=18/82 to 25/75, particularly $W_{Si}/W_{SiC}$=19/81 to 21/71.

If the weight ratio $W_{Si}/W_{SiC}$ is less than the aforesaid range (the amount of Si is smaller), the size of the pores in the three-dimensional network structure is excessively small, so that a greater number of vacant pores unfilled with Si are present in the three-dimensional network structure. Some of the vacant pores are exposed in the mount surface of the composite heat sink substrate after the polishing of the mount surface, whereby the number of defects of any of the types (i) to (iii) may be increased out of the range specified by the present invention. If the weight ratio $W_{Si}/W_{SiC}$ is greater than the aforesaid range (the amount of Si is greater), the thermal conductivity of the heat sink substrate may be reduce.

The preparation of the product from the mixture of the ceramic powder and the organic binder is achieved, for example, by mixing the mixture with a solvent capable of dissolving the organic binder in a predetermined mixing ratio for preparation of a slurry, granulated the slurry by spray-drying, and then press-molding the resulting granule into a predetermined shape by a dry pressing molding, or by mixing the mixture with a solvent capable of dissolving the organic binder in a predetermined mixing ratio for preparation of a paste, then molding the paste into a predetermined shape by a molding method such as an extrusion molding or a slip casting molding, and drying the resulting product.

The product is heated to a temperature not lower than the thermal decomposition temperature of the organic binder in a vacuum for removing the organic binder, and then fired in a non-oxidative atmosphere, for example, in a vacuum, in an inert gas atmosphere or in a reduction atmosphere for sintering the ceramic powder, thereby providing the three-dimensional network structure. The following conditions are preferably employed for the firing: a firing temperature of 2000 to 2500° C., particularly 2300 to 2400° C.; and a firing period of 30 minutes to 5 hours, particularly 1 to 2 hours.

If the firing temperature is lower than the aforesaid range, SiC particles are insufficiently bound in the three-dimensional network structure to reduce the thermal conductivity due to grain boundaries. As a result, the thermal conductivity of the heat sink substrate produced from the three-dimensional network structure may be reduced. If the firing temperature is higher than the aforesaid range, initial costs and running costs of firing equipment are increased, and time required for increasing and reducing the temperature is increased. This may reduce the productivity of the three-dimensional network structure and hence the productivity of the heat sink substrate.

If the firing period is shorter than the aforesaid range, the SiC particles are insufficiently bound in the three-dimensional network structure to reduce the thermal conductivity due to grain boundaries. As a result, the thermal conductivity of the heat sink substrate produced from the three-dimensional network structure may be reduced. If the firing period is longer than the aforesaid range, too much time is required for the firing, which may reduce the productivity of the three-dimensional network structure and hence the productivity of the heat sink substrate.

The Si to be infiltrated into the three-dimensional network structure has a purity of not less than 99 wt %, particularly not less than 99.8 wt %. If the purity is less than the aforesaid range, the thermal conductivity of the heat sink substrate may be reduced.

In order to improve the wettability of the mount surface of the heat sink substrate of the present invention with the solder or the brazing filler metal, the mount surface is preferably coated with a plating layer such as a Ni electrolytic plating layer, a Ni—P plating layer, a Ni—B plating layer or a Au plating layer. In order to improve the wettability and prevent the reduction in the efficiency of the heat conduction from the semiconductor device, the plating layer preferably has a thickness of 0.5 to 7 μm, particularly 4 to 5 μm.

An area of the plating layer other than an area which a semiconductor device is to be mounted is preferably coated with a resist film in order to prevent the solder or the brazing filler metal from spreading out of the area which a semiconductor device is to be mounted of the plating layer and to provide a sufficient amount of the solder or the brazing filler metal between the bonding surface of the semiconductor device and the mounting surface. A resist film which can be patterned by a photolithography method and has a heat resistance sufficient to withstand heat applied when the semiconductor device is mounted with the use of the solder or the brazing filler metal, for example, is preferably used as the resist film.

The production method of the present invention for the heat sink substrate includes the steps of infiltrating the three-dimensional network structure with the thermally melted Si, and cooling the resulting structure to solidify the Si, wherein the infiltrating step and the cooling step are performed in a non-oxidative atmosphere in the presence of an oxygen absorber disposed in non-contact with the three-dimensional network structure and the Si and absorbs oxygen at a temperature not lower than the melting point of Si.

The production method of the present invention can be implemented in substantially the same manner as the conventional melt-infiltration method, except that the oxygen absorber is provided in the melt-infiltration system. More specifically, the three-dimensional network structure, a solid Si of the basis of Si melt and the oxygen absorber are first placed in a chamber of a vacuum apparatus for the melt-infiltration method, and then a vacuum pump of the vacuum apparatus is driven to decompress the chamber into a vacuum state at about 10 to about 100 Pa. Thus, oxygen present in the chamber, particularly in the three-dimensional network structure, is drawn out as much as possible.

Then, the vacuum pump is stopped, and a non-oxidative gas is supplied into the chamber. Thus, the atmosphere of the chamber, particularly the inside of the three-dimensional network structure, is once replaced with a non-oxidative gas atmosphere at a pressure of 0.05 Mpa to an atmospheric pressure. Thereafter, the inside temperature of the chamber is raised, while the inside of the chamber is kept in a vacuum state at about 10 to about 1020 Pa by driving the vacuum pump and controlling the supply amount of the non-oxidative gas. When the inside temperature of the chamber reaches a level not lower than the melting point (=1450° C.) of Si, particularly 1500 to 1800° C., the solid Si is melted into the Si melt, which is in turn infiltrated into the pores of the three-dimensional network structure.

Examples of the non-oxidative gas to be supplied into the chamber include Ar gas and $N_2$ gas. Particularly, Ar gas is preferred, which is non-reactive with SiC and Si. The inside pressure of the chamber is preferably 10 to 1020 Pa. If the inside pressure is higher than the aforesaid range, the non-oxidative gas present in the pores of the three-dimensional network structure prevents the Si melt from being infiltrated into the pores. Therefore, vacant pores unfilled with the Si melt may occur in the three-dimensional network structure.

If the inside pressure of the chamber is to be kept below the aforesaid range, the extent which discharges leak of the atmosphere from the outside of the chamber out of the chamber by vacuum pump increases. This increases the amount of atmospheric oxygen passing through the chamber, though the apparent inside pressure of the chamber is kept at a lower level. Therefore, the problems associated with the oxidation of Si may occur as described above. Accordingly, the inside pressure of the chamber is preferably 10 to 1020 Pa.

Any of various known melt-infiltration methods may be employed for infiltrating the Si melt into the three-dimensional network structure. A particularly preferred method is as follows. The solid Si is first placed on the three-dimensional network structure in the chamber of the vacuum apparatus, and the inside temperature of the chamber is increased to a level not lower than the melting point of Si to melt the Si. Then, the resulting Si melt is infiltrated into the pores of the three-dimensional network structure by its weight. This method ensures smooth infiltration of the Si melt into the pores of the three-dimensional network structure, thereby preventing occurrence of vacant pores unfilled with the Si in the three-dimensional network structure. When the infiltration is carried out by this method, a carbon sheet or a Si-coated alumina sheet that functions to absorb the Si melt is preferably disposed below the three-dimensional network structure in spaced relation therefrom.

Since a space is present below the three-dimensional network structure, it is possible to provide a path for the Si melt infiltrated into the pores of the three-dimensional network structure from above and flowing down by its weight. Therefore, the Si melt can smoothly flow in the pores. This ensures smooth infiltration of the Si melt into the pores of the three-dimensional network structure, thereby further assuredly preventing the occurrence of the vacant pores unfilled with the Si in the three-dimensional network structure.

The carbon sheet or the like disposed below the three-dimensional network structure absorbs an excess amount of the melt dripping from the three-dimensional network structure to prevent the melt from filling the space and spreading out in the chamber. In order to maintain the three-dimensional network structure above the carbon sheet or the like in spaced relation from the sheet, a jig such as of a carbon material capable of absorbing the Si melt is preferably used for holding the three-dimensional network structure.

Any of various materials which have a greater affinity for oxygen than for the Si at a temperature not lower than the melting point of Si may be used as the oxygen absorber to be provided in the chamber. A particularly preferred example of the oxygen absorber is Al. In order to prevent Al from being melted and fluidized during the thermal melting of the Si, Al is preferably used in the form of an Al/SiC ceramic composite.

The Al/SiC ceramic composite may be prepared by a reaction sintering method or a melt-infiltration method. In order to prevent Al melted during the thermal melting of the Si from flowing out of the Al/SiC composite, an Al/SiC ratio is preferably determined so that Al is present in a proportion of not greater than 10 wt %, particularly about 5 wt %, based on the total amount of the Al/SiC composite. The Al/SiC composite and the composite of the three-dimensional network structure and Si produced by the melt-infiltration method are present in a weight ratio of 0.1:1 to 1:1 in the chamber.

The composite produced by infiltrating the Si into the pores of the three-dimensional SiC ceramic network structure by the melt-infiltration method is cooled to a room temperature and taken out of the chamber, and subjected to a grinding process, an electrical discharge machining process, a polishing process and the like for shaping thereof. Thus, a heat sink substrate having a predetermined shape is produced.

In the production method, the oxygen absorber present in the system prevents the surface Si of the Si melt from being oxidized during the melt-infiltration. Therefore, the inside of the three-dimensional network structure can be sufficiently filled with the Si melt. Since the oxidation of Si is prevented, it is possible to produce the heat sink substrate of the present invention having an oxygen content of not greater than 7 ppm and a significantly reduced number of defects of the types (i) to (iii) present in the mount surface thereof. Even if the heat sink substrate has a larger surface area particularly, the probability of the occurrence of the defects of the types (i) to (iii) in the mount surface is significantly reduced and, therefore, the larger area heat sink substrate can be mass-produced with a higher yield.

EXAMPLES

Example 1

<Preparation of Three-Dimensional Network Structure>

For preparation of a slurry, α-SiC powder (containing 99.0 wt % of SiC, 0.15 wt % of Si and 0.05 wt % of C, and having an average particle diameter of 45 μm), an organic binder and a solvent capable of dissolving the organic binder were mixed in a weight ratio which permits preparation of a three-dimensional network structure having pores such that a heat sink substrate as a final product has a Si/SiC weight ratio $W_{Si}/W_{SiO}$ of 20/80. In turn, the resulting slurry was granulated by spray-drying, and then the resulting powder was molded into a plate shape having a length of 250 mm, a width of 200 mm and a thickness of 5 mm by a slip casting method.

The product was heated at a temperature of 600° C. in a vacuum at a pressure of 101 Pa for one hour for removal of the organic binder. Then, the molded plate was fired at a temperature of 2300° C. in a non-oxidative atmosphere at a pressure of 101 Pa for one hour with Ar gas introduced as a non-oxidative gas for sintering the ceramic powder. Thus, a three-dimensional network structure of a plate shape having a length of 250 mm, a width of 200 mm and a thickness of 5 mm was prepared.

The overall volume $V_{Total}$ of the three-dimensional network structure was determined by measuring the dimensions of the three-dimensional network structure, and the weight. $W_{SiC}$ of the SiC ceramic was measured as the weight of the three-dimensional network structure. Then, the volume $V_{SiC}$ of SiC in the three-dimensional network structure was determined based on the theoretical density $\rho_{SiC}$ of SiC from the following expression (1):

$$V_{SiC}=W_{SiC}/\rho_{SiC} \quad (1)$$

Further, the weight $W_{Si}$ of Si infiltrated into the pores of the three-dimensional network structure by the melt-infiltration method was determined based on the volumes $V_{Total}$ and $V_{SiC}$ and the theoretical density $\rho_{Si}$ of Si from the following expression (2):

$$W_{Si}=(V_{Total}-V_{SiC})/\rho_{Si} \quad (2)$$

Then, the ratio $W_{Si}/W_{SiC}$ of the weight $W_{Si}$ of Si to the weight $W_{SiC}$ of the SiC ceramic of the three-dimensional network structure was determined. It was confirmed that the weight ratio $W_{Si}/W_{SiC}$ was 20/80.

<Production of Heat Sink Substrate>

A 165 g plate of an Si (having a purity of 99.9 wt %) was placed on the three-dimensional network structure, which was in turn held above a carbon sheet in a chamber of a vacuum apparatus so as to be vertically spaced 1 mm from the carbon sheet by a carbon jig.

A plurality of Al/SiC composite materials prepared by a reaction sintering method were provided as an oxygen absorber around the three-dimensional network structure held by the jig. In the Al/SiC composite materials, Al was present in a proportion of 5 wt % based on the total weight of the composite materials. The weight ratio between the Al/SiC composite materials present in the chamber and the composite of Si and the three-dimensional network structure to be prepared by the melt-infiltration method in the chamber was 0.2:1.

By driving a vacuum pump of the vacuum apparatus with the chamber closed, the inside of the chamber was kept in a vacuum state at a pressure of 100 Pa for 30 minutes, whereby oxygen was expelled from the chamber, particularly from the three-dimensional network structure. Then, the vacuum pump was stopped, and Ar gas was supplied as a non-oxidative gas into the chamber, whereby the atmosphere in the chamber, particularly the inside of the three-dimensional network structure, was once replaced with an Ar gas atmosphere at a pressure of 0.08 MPa. Thereafter, the vacuum pump was driven again, and the inside temperature of the chamber was raised while the inside of the chamber was kept in a vacuum state at a pressure of 101 Pa by controlling the supply amount of Ar gas. Then, the inside temperature of the chamber was raised up to 1600° C. in two hours, and kept at this level to melt the Si plate. Thus, the resulting Si melt was infiltrated into the pores of the three-dimensional network structure.

After almost all the Si plate was melted and the resulting Si melt was assuredly infiltrated into the pores of the three-dimensional network structure, the inside temperature of the chamber is reduced to a room temperature in five hours. Then, the vacuum pump was stopped to restore the inside pressure of the chamber to an atmospheric pressure, and a composite structure obtained by infiltrating the Si into the pores of the plate-shaped three-dimensional network structure was taken out of the chamber. The composite structure was subjected to a grinding process, an electrical discharge machining process, a polishing process and the like, and cut into a plurality of plates each having a length of 10 cm, a width of 10 cm and a thickness of 1 mm. Thus, a plurality of heat sink substrates were produced. The mount surface of each of the heat sink substrates was polished so as to have a maximum height Rz of 1.9 μm. The heat sink substrates each had a coefficient thermal expansion of $3.0 \times 10^{-6}$/K, which was measured by means of a differential thermal linear expansion meter.

Examples 2 to 5

A plurality of heat sink substrates were produced in substantially the same manner as in Example 1, except that the weight ratios between the Al/SiC composite provided in the chamber and the composite of Si and the three-dimensional network structure were 0.05:1 (Example 2), 0.1:1 (Example 3), 0.5:1 (Example 4) and 0.8:1 (Example 5).

Examples 6 and 7

A plurality of heat sink substrates were produced in substantially the same manner as in Example 1, except that the inside temperatures of the chamber during the melt-infiltration were 1500° C. (Example 6) and 1800° C. (Example 7).

Examples 8 to 11

A plurality of heat sink substrates were produced in substantially the same manner as in Example 1, except that the inside pressures of the chamber during the melt-infiltration were 2 Pa (Example 8), 10 Pa (Example 9), 1020 Pa (Example 10) and 2040 Pa (Example 11).

Example 12

A plurality of heat sink substrates were produced in substantially the same manner as in Example 1, except that the weight ratio between the Al/SiC composite provided in the chamber and the composite of Si and the three-dimensional network structure was 0.05:1 and the inside pressure of the chamber during the melt-infiltration was 2 Pa.

Example 13

A plurality of heat sink substrates were produced in substantially the same manner as in Example 1, except that the composite structure obtained by the melt-infiltration was subjected to the grinding process, the electrical discharge machining process, the polishing process and the like and cut into a plurality of plates each having a length of 5 cm, a width of 10 cm and a thickness of 1 mm.

Example 14

A plurality of heat sink substrates were produced in substantially the same manner as in Example 1, except that the composite structure obtained by the melt-infiltration was subjected to the grinding process, the electrical discharge machining process, the polishing process and the like and cut into a plurality of plates each having a length of 20 cm, a width of 20 cm and a thickness of 1 mm.

Examples 15 to 17

A plurality of heat sink substrates were produced in substantially the same manner as in Example 1, except that $N_2$ gas was supplied as the non-oxidative gas into the chamber and the weight ratios between the Al/SiC composite provided in the chamber and the composite of Si and the three-dimensional network structure were 0.2:1 (Example 15), 0.1:1 (Example 16) and 0.5:1 (Example 17).

Example 18

A plurality of heat sink substrates were produced in substantially the same manner as in Example 1, except that $N_2$ gas was supplied as the non-oxidative gas into the chamber, the weight ratio between the Al/SiC composite provided in the chamber and the composite of Si and the three-dimensional network structure was 0.1:1, and the inside pressure of the chamber during the melt-infiltration was 10 Pa.

Comparative Example 1

A plurality of heat sink substrates were produced in substantially the same manner as in Example 1, except that no Al/SiC composite was provided in the chamber.

Comparative Example 2

A plurality of heat sink substrates were produced in substantially the same manner as in Comparative Example 1, except that the composite structure obtained by the melt-infiltration was subjected to the grinding process, the electrical discharge machining process, the polishing process and the like and cut into a plurality of plates each having a length of 20 cm, a width of 20 cm and a thickness of 1 mm.

Comparative Example 3

A plurality of heat sink substrates were produced in substantially the same manner as in Example 1, except that $N_2$ gas was supplied as the non-oxidative gas into the chamber and no Al/SiC composite was provided in the chamber.

<<Evaluation of Mount Surface>>

The number of defects of each of the types (i) to (iii) present in the mount surface of each of the heat sink substrates was determined by counting defects appearing in a microscopic photograph obtained by photographing the mount surface at a magnification factor of 20× by means of a stereoscopic microscope. An average of the numbers of defects determined for 10 heat sink substrates produced under the same conditions was calculated, and converted into the number of defects per unit area (50 cm²) of the mount surface. Thus, the numbers of the defects of the respective types (i) to (iii) present in the unit area of the mount surface, and the total number of the defects were determined.

<<Measurement of Oxygen Content>>

The oxygen content of each of the heat sink substrates was measured through an inert gas fusion/infrared absorption method by means of the aforesaid oxygen/nitrogen analyzer (EMGA-620 W available from Horiba Ltd.)

<<Measurement of Thermal Conductivity>>

The thermal conductivity of each of the heat sink substrates was measured by a laser flash method.

The results of the measurements are shown in Tables 1 and 2.

TABLE 1

| | Conditions for melt-infiltration | | | |
|---|---|---|---|---|
| | Non-oxidative gas | Melting Pressure (Pa) | Melting Temperature (° C.) | Weight ratio of Al/SiC composite |
| Example 1 | Ar | 101 | 1600 | 0.2 |
| Example 2 | Ar | 101 | 1600 | 0.05 |
| Example 3 | Ar | 101 | 1600 | 0.1 |
| Example 4 | Ar | 101 | 1600 | 0.5 |
| Example 5 | Ar | 101 | 1600 | 0.8 |
| Example 6 | Ar | 101 | 1500 | 0.2 |
| Example 7 | Ar | 101 | 1800 | 0.2 |
| Example 8 | Ar | 2 | 1600 | 0.2 |
| Example 9 | Ar | 10 | 1600 | 0.2 |
| Example 10 | Ar | 1020 | 1600 | 0.2 |
| Example 11 | Ar | 2040 | 1600 | 0.2 |
| Example 12 | Ar | 2 | 1600 | 0.05 |
| Example 13 | Ar | 101 | 1600 | 0.2 |
| Example 14 | Ar | 101 | 1600 | 0.2 |
| Example 15 | $N_2$ | 101 | 1600 | 0.2 |
| Example 16 | $N_2$ | 101 | 1600 | 0.1 |
| Example 17 | $N_2$ | 101 | 1600 | 0.5 |
| Example 18 | $N_2$ | 10 | 1600 | 0.1 |
| Comparative Example 1 | Ar | 101 | 1600 | 0 |
| Comparative Example 2 | Ar | 101 | 1600 | 0 |
| Comparative Example 3 | $N_2$ | 101 | 1600 | 0 |

As apparent from Tables 1 and 2, the heat sink substrates of Comparative Examples 1 to 3 each produced by the melt-infiltration method without providing the Al/SiC composite in the chamber each had an oxygen content of greater than 7 ppm, and the numbers of defects of the respective types (i) to (iii) present in the mount surface of each of these heat sink substrates were greater than one defect per 50 cm². On the other hand, the heat sink substrates of Examples 1 to 18 each produced with the Al/SiC composite provided in the chamber each had an oxygen content of not greater than 7 ppm, and the number of defects of at least one of the types (i) to (iii) present in the mount surface of each of these heat sink substrates was not greater than one defect per 50 cm².

As can be understood from Examples 1 to 5 and 12 in which the Al/SiC composite was provided in different weight ratios, the oxygen content of the heat sink substrate is reduced as the weight ratio of the Al/SiC composite increases, and it is preferred that the weight ratio between the Al/SiC composite and the composite of Si and the three-dimensional network structure is 0.1:1 to 1:1. As can be understood from Examples 1, 6 and 7 in which the inside temperature of the chamber was kept at different levels during the melt-infiltration, it is preferred that the inside temperature is kept at 1500 to 1800° C. As can be understood from Examples 1, and 8 to 12 in which the inside pressure of the chamber was kept at different levels during the melt-infiltration, it is preferred that the inside pressure is kept at 10 to 1020 Pa.

As can be understood from Examples 1, 13 and 14 in which the composite structures produced by the melt-infiltration were cut into different sizes, the numbers of the defects of the respective types (i) to (iii) present in the mount surface tend to increase as the cutting size increases. Even if the cutting size is increased, the present invention minimizes the numbers of the defects of the respective types. A comparison between Examples 15 to 18 which employed the $N_2$ gas as the non-oxidative gas instead of the Ar gas and Examples 1, 3 and 4 which employed the Ar gas under the same conditions shows that the Ar gas is more preferable as the non-oxidative gas.

The Present Application Corresponds to Japanese Patent Application No. 2006-124092 filed on Apr. 27, 2006 to the

TABLE 2

| | Heat sink board | | | | | | |
|---|---|---|---|---|---|---|---|
| | Size (cm) | Oxygen content (ppm) | Heat Conductivity (W/m·K) | Number of defects (/50 cm²) | | | |
| | | | | Type (i) | Type (ii) | Type (iii) | Total |
| Example 1 | 10 × 10 × 1 | 3 | 252 | 0.2 | 0 | 0.2 | 0.4 |
| Example 2 | 10 × 10 × 1 | 6 | 224 | 1.1 | 1.3 | 0.8 | 3.2 |
| Example 3 | 10 × 10 × 1 | 4 | 230 | 0.7 | 0.4 | 0.6 | 1.7 |
| Example 4 | 10 × 10 × 1 | 3 | 239 | 0.3 | 0.2 | 0.2 | 0.7 |
| Example 5 | 10 × 10 × 1 | 3 | 237 | 0.4 | 0.3 | 0.2 | 0.9 |
| Example 6 | 10 × 10 × 1 | 4 | 212 | 0.4 | 0.5 | 0.4 | 1.3 |
| Example 7 | 10 × 10 × 1 | 3 | 228 | 0.2 | 0.2 | 0.4 | 0.8 |
| Example 8 | 10 × 10 × 1 | 6 | 237 | 1.3 | 1.1 | 0.9 | 3.3 |
| Example 9 | 10 × 10 × 1 | 4 | 239 | 0.4 | 0.4 | 0.4 | 1.2 |
| Example 10 | 10 × 10 × 1 | 3 | 215 | 0.5 | 0.4 | 0 | 0.9 |
| Example 11 | 10 × 10 × 1 | 5 | 198 | 1.3 | 0.8 | 0.8 | 2.9 |
| Example 12 | 10 × 10 × 1 | 7 | 216 | 1.4 | 1.5 | 0.8 | 3.6 |
| Example 13 | 5 × 10 × 1 | 3 | 245 | 0.1 | 0.1 | 0 | 0.2 |
| Example 14 | 20 × 20 × 1 | 3 | 246 | 0.3 | 0.2 | 0.2 | 0.7 |
| Example 15 | 10 × 10 × 1 | 4 | 205 | 0.6 | 0.3 | 0.4 | 1.3 |
| Example 16 | 10 × 10 × 1 | 5 | 202 | 0.9 | 0.8 | 1.1 | 2.9 |
| Example 17 | 10 × 10 × 1 | 5 | 205 | 1.5 | 0.5 | 0.7 | 2.7 |
| Example 18 | 10 × 10 × 1 | 6 | 197 | 1.3 | 1.1 | 1.0 | 3.4 |
| Comparative Example 1 | 10 × 10 × 1 | 8 | 231 | 2.4 | 1.7 | 1.5 | 5.6 |
| Comparative Example 2 | 20 × 20 × 1 | 8 | 236 | 2.7 | 2.3 | 1.9 | 6.9 |
| Comparative Example 3 | 10 × 10 × 1 | 8 | 208 | 2.7 | 2.1 | 2.3 | 7.1 |

Japanese Patent Office, and disclosure of this application is incorporated herein by reference.

What is claimed is:

1. A heat sink substrate having a mount surface on which a semiconductor device is to be mounted, comprising a composite structure composed of a three dimensional network structure of SiC ceramic having pores infiltrated with Si, the heat sink substrate having a thermal conductivity of not less than 200 W/m·K and being configured to have an oxygen content of not greater than 7 ppm, wherein the oxygen content is selected so as to increase the efficiency of heat conduction from the semiconductor device to the heat sink substrate, and the number of defects of at least one of the following types (i) to (iii) present in a unit area of the mount surface is not greater than one defect per 50 cm$^2$:
   (i) a vacant pore having a diameter of 0.3 to 1.0 mm, or a Si block filling the vacant pore with Si having a diameter of 0.3 to 1.0 mm;
   (ii) a rough surface portion constituted by a plurality of minute vacant pores gathering in a surface direction, and having a diameter of 1.0 to 2.0 mm; and
   (iii) a crack-like portion constituted by a plurality of minute vacant pores linearly connected to one another, and having a length of 1.0 to 2.0 mm.

2. The heat sink substrate according to claim 1, wherein a surface area of the mount surface is 50 to 1000 cm$^2$.

3. The heat sink substrate according to claim 1, wherein the mount surface is coated with a plating layer.

4. The heat sink substrate according to claim 3, wherein an area of the plating layer other than an area on which a semiconductor device is to be mounted is covered with a resist film.

* * * * *